United States Patent [19]
McGuire et al.

[11] Patent Number: 4,712,024
[45] Date of Patent: Dec. 8, 1987

[54] ACTIVE BALUM STAR MIXER

[75] Inventors: Charles F. McGuire, Kaysville; David J. Weber, Sandy; Gordon C. Steyaert, Salt Lake City, all of Utah

[73] Assignee: Sperry Corporation, Blue Bell, Pa.

[21] Appl. No.: 766,187

[22] Filed: Aug. 16, 1985

[51] Int. Cl.$^4$ .......................... G06G 7/00; H03K 9/06
[52] U.S. Cl. .................................... 307/529; 307/271; 328/133; 329/166; 455/189
[58] Field of Search ...................... 307/529, 271, 219.1, 307/321; 328/26, 133; 329/166, 50; 363/127, 128; 455/137, 189

[56] References Cited
U.S. PATENT DOCUMENTS

| | | | |
|---|---|---|---|
| 3,121,843 | 2/1964 | Ule | 328/133 |
| 3,436,684 | 4/1969 | Mack | 329/166 |
| 3,436,685 | 4/1969 | Mack | 329/166 |
| 3,550,023 | 12/1970 | Webb | 329/50 |

Primary Examiner—Stanley D. Miller
Assistant Examiner—Richard Roseen
Attorney, Agent, or Firm—G. Donald Weber, Jr.; Glenn W. Bowen; Laurence J. Marhoefer

[57] ABSTRACT

A mixer circuit wherein transistors are used to drive Schottky diodes in a star configuration in order to avoid the disadvantages of transformer coupling.

13 Claims, 3 Drawing Figures

ACTIVE BALUM STAR MIXER

BACKGROUND

1. Field of the Invention.

This invention is directed to mixer circuits, in general, and to balanced, star configured mixer circuits, in particular.

2. Prior Art.

Mixer circuits of many varieties are known in the art. Many of these known mixer circuits are arranged to be symmetrical in configuration and operation. However, these circuits typically utilize toroids or transformers to effect signal coupling. There are several disadvantages of such toroidally coupled mixer circuits. For example, the transformers have to be wound by hand and then they have to be hand tuned. Thus, when the mixer is assembled, it is, typically, tested on a network analyzer and each one of the transformers is hand tuned. This operation is, of course, time consuming and expensive.

Furthermore, these standard mixers tend to be fairly bulky and require a substantial amount of space in a circuit application.

Likewise, in the standard mixer, the control signals from the local oscillator (i.e. the driving circuit) must be large enough to turn on the diodes which are included in the circuit. This means that the control signals can become rather large relative to the circuit application.

SUMMARY OF THE INVENTION

This invention is directed at a mixer circuit which uses four balanced transistors to drive four Schottky diodes which are connected in a star configuration. By prescreening the transistors to certain parameters of gain and impedance, the mixer circuit structure need not be tuned. The transistors are driven by a digital input signal and a reference input signal and the output signal is detected at the center node of the diode star. Appropriate potential sources and resistors are connected to form a bridge network in conjunction with the star network.

DESCRIPTION OF A PREFERRED EMBODIMENT

Figure 1:
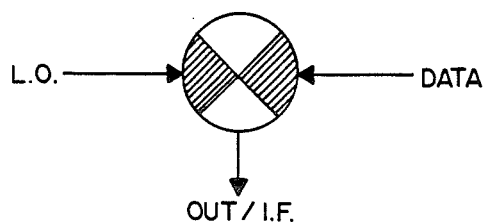
FIG. 1 is a conventional symbol of a mixer circuit.

Referring now to FIG. 1 there is shown a symbolic representation of a mixer circuit. The mixer 10 incorporates, in this instance, a local oscillator input port LO and a digital input port DATA. The output port OUT-/IF is used to provide the output signal IF which represents the product of the two input signals. This symbology and circuit operation are conventional in the art.

Figure 2:
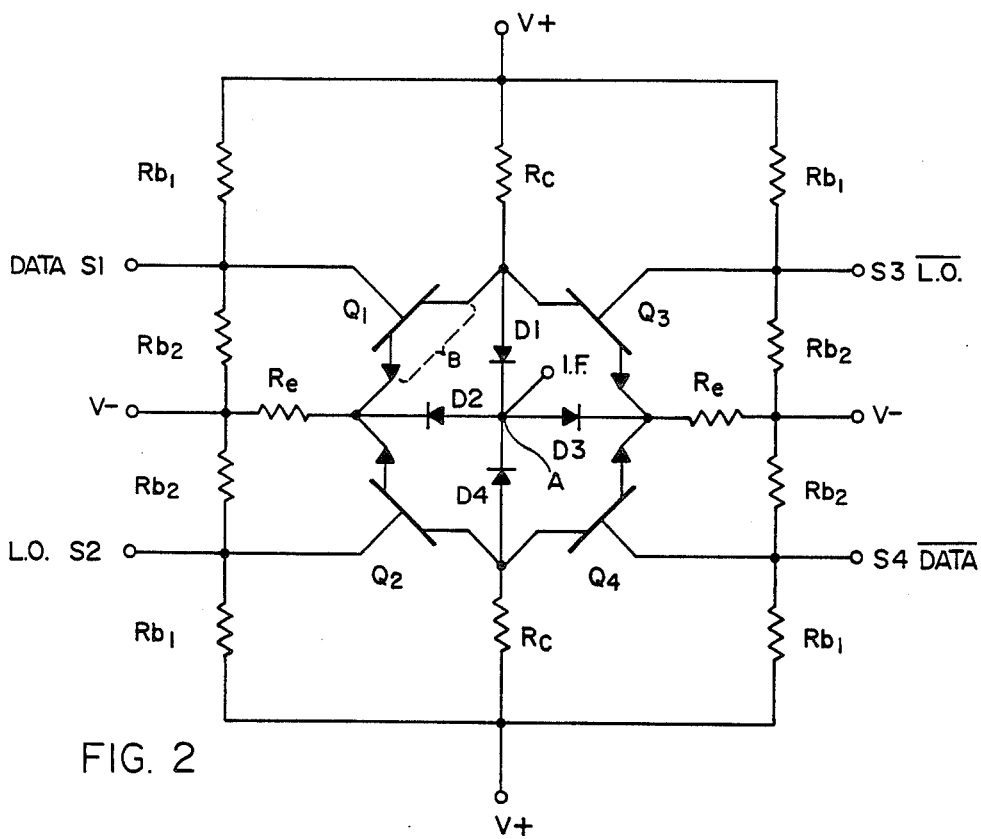
FIG. 2 is a schematic illustration of the circuit of the instant invention.

Referring now to FIG. 2, there is shown a schematic illustration of one embodiment of the instant invention. In this instance, the ports S1 and S4, in combination are equivalent to the DATA port while ports S2 and S3 are equivalent to the LO port. The output port at mode A is equivalent to the output port OUT/IF. Thus, there are three ports, DATA, LO and IF. In this case, the two input ports (DATA and LO) can be interchanged because of the symmetry of the circuit. It is possible to drive either input port with a large or small signal. However, the output IF port does not change. It is always the same port and is always located in the center or common junction of the star circuit.

One advantage of this circuit is the high isolation provided thereby. That is, the circuit is an isolation amplifier between the input port and the diode structure of the mixer so that there is little or no leakage from the LO port to the IF port.

Moreover, this circuit is a bi-phase modulator which is intended for digital signal operation. Therefore, it has two states. In state 1, the signal VSIG2 is produced on the IF output terminal. Conversely, in state 2, the inverse of the signal VSIG2 (viz $\overline{VSIG2}$) is produced at the IF output terminal. This situation is based upon the fact that in a transistor amplifier, the signal on the emitter is exactly in phase with the input signal and the signal on the collector is exactly 180° out of phase therewith.

In state 1, transistor Q1 is on, and transistor Q4 is off. Consequently, transistor Q1 is equivalent to a short circuit while transistor Q4 is non-conductive. Upon examining the circuit of transistor Q1, which can now be considered as node B (shown in dashed line), the voltage at node B is the DC component plus the resistance current value at node B, looking back toward the power supplies which are ground. From transistor Q2 a current component is supplied to the node B together with the current from signal SIG1 which is supplied to the node. Transistor Q3 is drawing the same current from the node B. Therefore, the two currents cancel and there is no voltage impressed upon node B from the two small signal transistors Q2 and Q3.

On the other hand, at the other side of the circuit, the current being drawn into transistor Q2 flows through the resistor Rc and impresses a small voltage which is 180° out of phase with the input SIG2 because it is on the collector side of transistor Q2. However, at the emitter side of transistor Q3 is the inverse of the signal at terminal S3 which is 180° out of phase with the input signal SIG1. Thus, the voltage signal impressed upon the collector side of transistor Q2 is the same voltage as at the emitter side of transistor Q3. These elements are connected through diodes D3 and D4. These diodes produce a fixed voltage drop thereacross such that there is a constant voltage differential. Therefore, the voltage VSIG2 is imposed upon the IF terminal.

Looking now at state 2, the same analysis applies because of the symmetry of the circuit. But now, keeping the reference point with input signal SIG2, it is seen that the constant voltage point is on the collector side of transistor Q2 and the point that is moving is on the emitter side of transistor Q3. Thus, the phase impressed at the IF port is flipped by 180° which is the desired result. Moreover, this action has been produced using transistors that do not require tuning.

Figure 3:
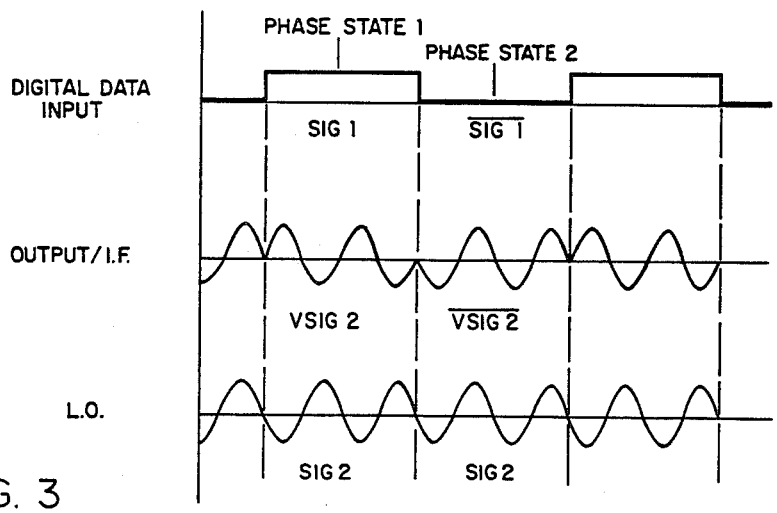
FIG. 3 is a graphic representation of the signals associated with the instant circuit.

Referring now to FIG. 3, it is seen that the output has a digitally switched phase. More particularly, it is a bi-phase signal. This signal permits a signal with two states, viz. on "on" digital state and an "off" digital state. Also, the IF signal is changed from an in-phase condition to a 180° out-of-phase condition which is a BPSK (bi-phase modulation switched) operation. Thus, the output signal IF is produced by the signals SIG1 and SIG2, and is exactly in-phase or out-of-phase with the signal SIG2. As a result, the circuit permits a device connected to the IF output terminal to "listen" to terminal S3 until the digital signal toggles whereupon terminal S2 is "listened" to. This "toggle" occurs at the transition from state 1 to state 2 at the input signal. This phase shift permits the circuit to operate as a modulator. One application of this circuit is in spread spectrum systems for modulation of data links, for example. In this application, digital data is inputted into a system with a code data. This data is phase shifted so that it spreads the energy in that sine wave out a long way. However, this circuit permits the shift to occur, reliably, at 180°.

In order to provide balanced components such as transistors, resistors, diodes and the like, it is desirable to produce a monolithic device wherein the components are fabricated on the same wafer. If the components are produced on a monolithic chip, all of the circuit is processed in the same IC batch and therefore, the parameters of each of the transistors are identical. The transistors can be bi-polar or FET type.

Thus, there is shown and described a preferred embodiment of a balun star mixer circuit. The description is directed to a particular circuit configuration. Other circuit configurations may be possible and may be developed by those skilled in the art. However, any such configurations which fall within the purview of the description herein are intended to be included therein as well. That is, this description is not intended to be limitative of this invention. Rather, the scope of the invention is limited only by the claims appended hereto.

We claim:

1. A mixer circuit comprising,
   first and second diodes having a respective cathode thereof connected together,
   third and fourth diodes having a respective anode thereof connected together and to the cathodes of said first and second diodes at a common junction to provide an output terminal,
   first source means connected to each respective anode of said first and second diodes,
   second source means connected to each respective cathode of said third and fourth diodes,
   first transistor means having its emitter-collector conduction path connected between the anode of said first diode and the cathode of said fourth diode,
   second transistor means having its emitter-collector conduction path connected between the anode of said first diode and the cathode of said third diode,
   third transistor means having its emitter-collector conduction path connected between the anode of said second diode and the cathode of said fourth diode,
   fourth transistor means having its emitter-collector conduction path connected between the anode of said second diode and the cathode of said third diode,
   first input means supplying switching signals to the control electrode of each of said second and third transistor means, and
   second input means supplying oscillator signals to the control electrode of each of said first and fourth transistor means.

2. The mixer circuit recited in claim 1 wherein, said first input means supplies complementary switching signals to the control electrodes of said second and third transistor means whereby one of said second and third transistor means is selectively conductive and the other one is selectively nonconductive.

3. The mixer circuit recited in claim 1 wherein, said second input means supplies complementary oscillator signals to the control electrodes of said first and fourth transistor means.

4. The mixer circuit recited in claim 1 wherein, said first and second source means supply voltages with the same magnitude but opposite polarity.

5. The mixer circuit recited in claim 1 including, impedance means connected between each of said input means and each of said source means.

6. The mixer circuit recited in claim 5 including, further impedance means connected between each of said source means and the connection of each of said diodes to a transistor means.

7. The mixer circuit recited in claim 1 wherein, the output signal produced at the common junction of the terminals of said first, second, third and fourth diodes has a frequency which is a function of the oscillator signals supplied by said second input means and a phase which is a function of the switching signals supplied by said first input means.

8. The mixer circuit recited in claim 1 wherein, each of said transistor means includes an emitter-type electrode and a collector-type electrode in the conduction path thereof,
   the emitter-type electrodes of said first and third transistor means are connected to the anode of said fourth diode, and
   the emitter-type electrodes of said second and fourth transistor means are connected to the anode of said third diode.

9. The mixer circuit recited in claim 1 wherein, said first input means produces digital input signals, and said second input means produces analog input signals.

10. The mixer circuit recited in claim 1 wherein, each said transistor means comprises a field effect transistor (FET).

11. The mixer circuit recited in claim 1 wherein, each said diode means comprises a Schottky diode.

12. The mixer circuit recited in claim 1 wherein, the second and third transistor means connected to said first input means operate as switching transistors which are selectively operative.

13. The mixer circuit recited in claim 1 wherein, the first and fourth transistor means connected to said second input means operate as amplifier means.

* * * * *